United States Patent [19]

Wood

[11] 4,218,271

[45] Aug. 19, 1980

[54] METHOD OF MANUFACTURING SEMICONDUCTOR DEVICES UTILIZING A SURE-STEP MOLECULAR BEAM DEPOSITION

[75] Inventor: Colin E. C. Wood, Crawley, England

[73] Assignee: U.S. Philips Corporation, New York, N.Y.

[21] Appl. No.: 895,705

[22] Filed: Apr. 12, 1978

[30] Foreign Application Priority Data

Apr. 13, 1977 [GB] United Kingdom ............... 15291/77

[51] Int. Cl.² ................... H01L 21/203; H01L 23/48
[52] U.S. Cl. ........................................ 148/175; 29/571; 148/1.5; 148/174; 156/612; 357/4; 357/16; 357/18; 357/22; 357/65; 357/67; 357/71
[58] Field of Search .................. 148/1.5, 174, 175; 29/571; 427/88, 91; 357/4, 16, 18, 22, 65, 67, 71; 156/612

[56] References Cited

U.S. PATENT DOCUMENTS

| | | | |
|---|---|---|---|
| 3,386,867 | 6/1968 | Staples | 357/67 X |
| 3,751,310 | 8/1973 | Cho | 148/175 |
| 3,839,084 | 10/1974 | Cho et al. | 148/175 X |
| 3,863,334 | 2/1975 | Coleman | 357/67 X |
| 3,915,765 | 10/1975 | Cho et al. | 148/175 |
| 3,941,624 | 3/1976 | Cho | 148/175 |
| 3,987,480 | 10/1976 | Diguet et al. | 357/67 X |

OTHER PUBLICATIONS

Aleksandrov, L. N., "Formation and Properties . . . Films" J. Crystal Growth, v. 31, 1975, pp. 103–112.

Primary Examiner—L. Dewayne Rutledge
Assistant Examiner—W. G. Saba
Attorney, Agent, or Firm—Thomas A. Briody; Robert T. Mayer; Paul R. Miller

[57] ABSTRACT

Method of making a semiconductor device which includes a III-V compound stratum. A film consisting of one of the elements Sn, Ge, Si, Be, Mn or Mg is deposited by an M.B.E. process on an exposed surface of the III-V compound stratum. A III-V compound layer doped with the element constituting the film is deposited over the film, when making, for example an F.E.T. An ohmic contact layer is deposited over the film to make an ohmic contact.

5 Claims, 6 Drawing Figures

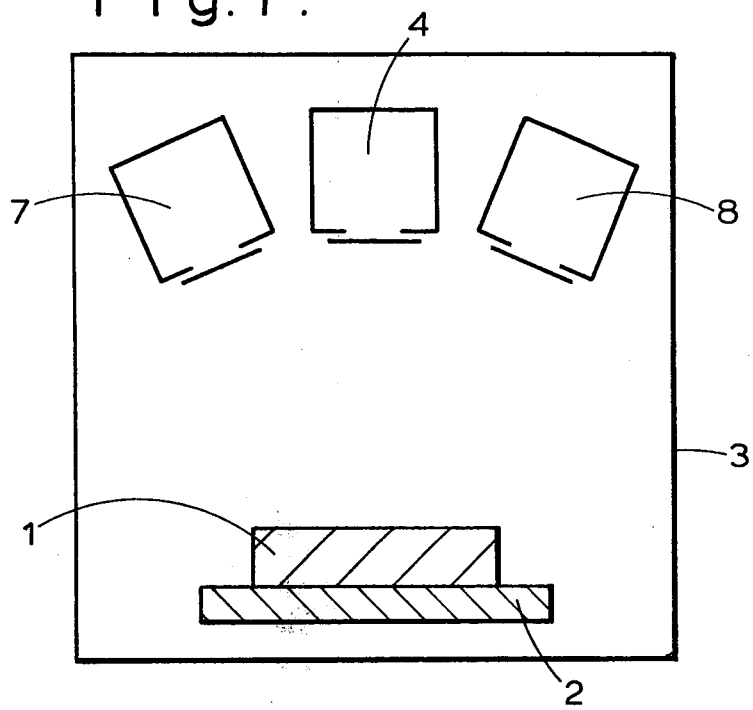
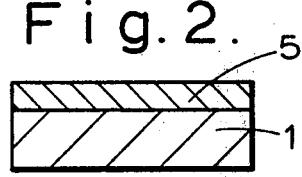
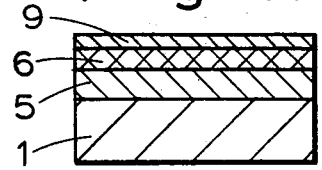
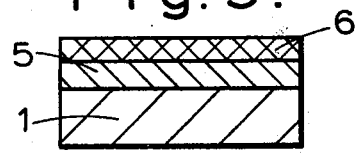
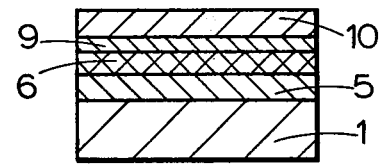
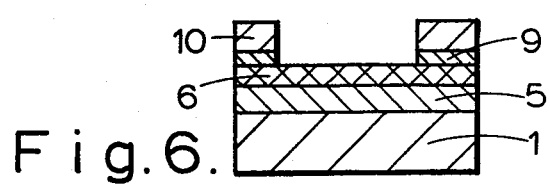

METHOD OF MANUFACTURING SEMICONDUCTOR DEVICES UTILIZING A SURE-STEP MOLECULAR BEAM DEPOSITION

The invention relates to a method of manufacturing a semiconductor device which includes a III-V compound stratum and to a semiconductor device manufactured by such a method. Stratum is to be understood to mean also a monocrystalline substrate or an epitaxial layer present on a substrate or on another epitaxial layer. This method may be used for manufacturing devices, for example field effect transistors, microwave diodes or laser diodes, in which charge carriers flow in a thin (of the order of 1 micron thick) layer of high conductivity. This method may also be used to obtain improved ohmic contacts formed on grown III-V contacts compound strata.

United Kingdom Pat. No. 1,270,550 describes a method of forming an epitaxial film of a III-V compound on a substrate surface at a subatmospheric pressure, the substrate surface being preheated to a temperature in the range from 450° to 650° C., and a collimated molecular beam or beams comprising the constituent components of the film is or are directed at the preheated substrate surface for a sufficient period to form an epitaxial film of a desired thickness. Such an epitaxial film may form part of a field effect transistor.

A field effect transistor comprises, for example a semi-insulating GaAs substrate bearing an epitaxially deposited doped GaAs film, together with source, gate and drain electrodes extending from the film. It was found when using a Schottky diode gate that the current falls off linearly as the voltage applied between the gate and source electrodes was increased. When such a device was operated at 10 GHz, it was found that the gain associated with the minimum noise of the device was significantly less than the maximum available gain of the device.

One object of the invention is to manufacture a field effect transistor in which the gain associated with the minimum noise is not significantly less than the maximum available gain. Another object of the invention is to make semiconductor devices in which the ohmic contacts have lower contact resistances than in similar known devices.

The invention provides a method of manufacturing a semiconductor device including a III-V compound stratum, in which method a layer consisting of one of the elements Sn, Ge, Si, Be, Mn or Mg is deposited by a molecular beam process on an exposed surface of the III-V compound stratum.

According to one aspect of the invention, the method includes the steps of depositing a coating of from $10^{12}$ to $10^{15}$ atoms/sq. cm. of one of the elements Sn, Ge, Si, Be, Mn or Mg by a molecular beam process on an exposed surface of a semi-insulating III-V compound substrate, and depositing a 0.05 to 1.5 $\mu$m thick film of a doped III-V compound on the coating by a molecular beam process, wherein the dopant in the doped III-V compound is the element consituting the coating, and the doped III-V compound contains from $1 \times 10^{16}$ to $3 \times 10^{17}$ atoms/cm$^3$ of dopant. The semiconductor device manufactured by this method may be, for example, a field effect transistor or a laser diode.

According to another aspect of the invention, the method includes the steps of depositing a contacting film of from $10^{14}$ to $10^{19}$ atoms/sq. cm. of one of the elements Sn, Ge, Si, Be, Mn or Mg by a molecular beam process on an exposed surface of an epitaxially grown III-V compound stratum, and depositing a contact layer consisting of Sn, Be, Mg, Mn or an alloy of Pt, Ag or Au with any of the elements Sn, Ge, Si, Be, Mg or Mn onto the contacting film. The contact layer together with the subjacent contacting film constitute an ohmic contact.

During the investigations which led to the invention, it was found that a limitation on the performance of a gallium arsenide F.E.T. occurs when all the current is passing through a very thin part of a layer adjoining the substrate, which part of the layer is the first grown part. This results since the electrical resistance in this first grown part of the layer is significantly higher than the resistance in the remainder of the layer. The increase in resistance may be due to a reduction in carrier density or to a reduction in carrier mobility in the layer of doped gallium arsenide.

Experiments were conducted to determine the carrier loss from 0.3$\mu$m thick gallium arsenide layers doped with $1 \times 10^{17}$ tin atoms/cm$^3$ and deposited by molecular beam epitaxy on semi-insulating gallium arsenide substrates. There was found to be a loss from the layers of from 2 to $4 \times 10^{12}$ donors/cm$^2$. A film consisting of $3 \times 10^{12}$ atoms of tin/cm$^2$ was deposited on a semi-insulating gallium arsenide substrate, and a 0.3 $\mu$m thick layer of gallium arsenide doped with $10^{17}$ atoms of tin/cm$^3$ was deposited over the film. It was found that the carrier density in the layer was now uniform throughout the thickness of the layer.

It was found with gallium arsenide F.E.T.'s manufactured using a method according to the invention, that although there was no improvement in the minimum noise of an F.E.T. compared with an F.E.T. in which there was no deposit of dopant between the semi-insulating gallium arsenide substrate and the grown layer (in fact the noise in the former F.E.T. was up to 10% more than the noise of the latter F.E.T.), the gain associated with minimum noise for a gallium arsenide F.E.T. made by a method according to the invention was approximately 50% larger than the gain associated with minimum noise in a similar gallium arsenide F.E.T. which has no dopant deposit between the GaAs substrate and the grown layer.

It was also found that the method according to the invention could be used for improving the quality of ohmic contacts formed on grown III-V compound strata.

An embodiment of the invention will now be described with reference to the following Example, and to the accompanying schematic drawing in which:

FIG. 1 is a diagrammatic side-elevational of molecular beam epitaxy system used to perform the method according to the invention, and FIGS. 2 to 6 are diagrammatic sectional elevations of a semiconductor assembly at successive stages of formation by means of the method according to the invention.

EXAMPLE

FIG. 1 shows a semi-insulating GaAs substrate 1 doped with 1 p.p.m. of chromium and which is mounted on the radiation-type heater 2 in a vacuum chamber 3. The substrate 1 was heated at 580° C. for 10 minutes in the vacuum chamber at a pressure of $10^{-6}$ torr in an atmosphere consisting mainly of water vapour in order to remove carbon present on the surface of the substrate.

Tin was produced in atomic beam form from a Knudsen effusion cell 4 at 800° C. and was allowed to impinge for 5 minutes upon the substrate 1 which was maintained at a temperature of 550° C., the pressure in the vacuum chamber being $10^{-6}$ Torr. A tin coating 5 (FIG. 2) which consisted of $5 \times 10^{12}$ atoms of tin per sq.cm was produced on the substrate 1 by this treatment.

The temperature of the substrate was maintained at 550° C. during the deposition of a tin-doped gallium arsenide layer 6 (FIG. 3) over the tin coating 5. An arsenic ($As_4$) flux was generated in a Knudsen effusion cell 7 which was heated at 300° C., a tin flux was generated by maintaining the Knudsen cell 4 at 760° C. and a gallium flux was generated by means of a Knudsen effusion cell 8 heated at 1120° C. The growth rate of the tin-doped gallium arsenide produced is set by the Ga flux since an excess of $As_4$ flux is used, the excess $As_4$ being reflected from the deposition surface, while all the tin and gallium incident on the deposition surface stick. A 0.3 μm thick layer of gallium arsenide having a donor concentration of $5 \times 10^{16}/cm^3$ of a perfect monocrystalline quality was grown in 18 minutes. This assembly was used to make field effect transistors, a source contact, a drain contact and a Schottky gate contact being formed by techniques which are conventional in the art. These transistors were operated at 10 GHz and were found to have a maximum available gain of 9.2 dB, a minimum noise of 4.7 dB, and a gain associated with the minimum noise of 9 dB. Similar field effect transistors, made from an assembly which was identical with that used to make the first-mentioned field effect transistors, except that the assembly contained no tin coating 5, had a maximum available gain of 8.5 dB, a minimum noise of 4.4 dB, and a gain associated with the minimum noise of 6 dB.

An ohmic contact layer was formed over the gallium arsenide assembly shown in FIG. 3 using the apparatus shown in FIG. 1. When deposition of the gallium arsenide layer 6 had been complete, the shutters of the Knudsen cells 7 and 8 were closed, the temperature of the Knudsen cell 4 was then raised to 1100° C. and the temperature of the assembly on the support 2 was reduced to 180° C. which is below the melting and alloying temperature of tin. Tin deposition is continued for 10 minutes giving a 200Å thick contacting film 9 (FIG. 4). An ohmic contact layer 10 was formed by evaporation over the tin contacting film 9 (FIG. 5). Ohmic contacts at the required areas were defined by etching away the contact layer 10 and contacting film 9 at the areas where ohmic contacts were not required. (FIG. 6).

What is claimed is:

1. A method of manufacturing a semiconductor device comprising the steps of depositing a first layer of one of the elements Sn, Ge, Si, Be, Mn, or Mg on a III–V compound stratum by molecular beam deposition, and depositing a second layer of a III–V compound material containing said one element as a component on said first layer by molecular beam deposition.

2. A method according to claim 1, wherein said first step deposits a coating of from $10^{12}$ to $10^{15}$ atoms/sq.cm. of said one element on an exposed surface of a semi-insulating III–V compound substrate, and said second step deposits a 0.05 to 1.5 μm thick film of a doped III–V compound on said coating, said doped III–V compound including a dopant of $1 \times 10^{16}$ to $3 \times 10^{17}$ atoms/cm³ of said one element.

3. A method according to claim 2, wherein said one element is Sn.

4. A method according to claim 2, wherein said semiconductor device is a field effect transistor.

5. A method according to claim 2, wherein said semiconductor device is a laser diode.

* * * * *

UNITED STATES PATENT AND TRADEMARK OFFICE
CERTIFICATE OF CORRECTION

PATENT NO. : 4218271
DATED : August 19, 1980
INVENTOR(S) : Colin E.C. Wood

It is certified that error appears in the above-identified patent and that said Letters Patent are hereby corrected as shown below:

Change the title to read:

--METHOD OF MANUFACTURING SEMICONDUCTOR DEVICES UTILIZING A TWO STEP MOLECULAR BEAM DEPOSITION--

Signed and Sealed this

Twentieth Day of January 1981

[SEAL]

Attest:

RENE D. TEGTMEYER

*Attesting Officer*  *Acting Commissioner of Patents and Trademarks*